United States Patent
White et al.

(10) Patent No.: US 8,216,380 B2
(45) Date of Patent: Jul. 10, 2012

(54) GAP MAINTENANCE FOR OPENING TO PROCESS CHAMBER

(75) Inventors: Carl L. White, Gilbert, AZ (US); Eric Shero, Phoenix, AZ (US); Joe Reed, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 646 days.

(21) Appl. No.: 12/350,793

(22) Filed: Jan. 8, 2009

(65) Prior Publication Data

US 2010/0173432 A1    Jul. 8, 2010

(51) Int. Cl.
    *C23C 16/00*    (2006.01)
(52) U.S. Cl. .......................................... 118/729; 438/17
(58) Field of Classification Search .................. 118/712, 118/729; 257/E21.531; 438/17
    See application file for complete search history.

(56) References Cited

U.S. PATENT DOCUMENTS

| | | |
|---|---|---|
| 4,828,224 A | 5/1989 | Crabb et al. |
| 4,889,609 A | 12/1989 | Cannella |
| 5,186,718 A | 2/1993 | Tepman et al. |
| 5,286,296 A | 2/1994 | Sato et al. |
| 5,435,682 A | 7/1995 | Crabb et al. |
| 5,586,585 A | 12/1996 | Bonora et al. |
| 5,601,686 A | 2/1997 | Kawamura et al. |
| 5,609,689 A | 3/1997 | Kato et al. |
| 5,611,655 A | 3/1997 | Fukasawa et al. |
| 5,647,945 A | 7/1997 | Matsuse et al. |
| 5,651,868 A | 7/1997 | Canady et al. |
| 5,784,799 A | 7/1998 | Kato et al. |
| 5,785,796 A | 7/1998 | Lee |
| 5,788,778 A | 8/1998 | Shang et al. |
| 5,810,942 A | 9/1998 | Narayanswami et al. |
| 5,820,692 A | 10/1998 | Baecker et al. |
| 5,844,195 A | 12/1998 | Fairbairn et al. |
| 5,879,574 A | 3/1999 | Sivaramakrishnan et al. |
| 5,913,978 A | 6/1999 | Kato et al. |
| 5,934,856 A | 8/1999 | Asakawa et al. |
| 5,981,399 A | 11/1999 | Kawamura et al. |
| 5,997,588 A | 12/1999 | Goodwin et al. |
| 6,042,623 A | 3/2000 | Edwards |

(Continued)

FOREIGN PATENT DOCUMENTS

JP    1992-100222    4/1992

(Continued)

OTHER PUBLICATIONS

European Office Action issued May 4, 2007 in counterpart European Patent Application No. 03 731 267.8.

(Continued)

*Primary Examiner* — Sylvia R. MacArthur
(74) *Attorney, Agent, or Firm* — Knobbe Martens Olson & Bear LLP

(57) ABSTRACT

A semiconductor processing apparatus includes a reaction chamber, a movable susceptor, a movement element, and a control system. The reaction chamber includes a baseplate. The baseplate includes an opening. The movable susceptor is configured to hold a workpiece. The movable element is configured to move a workpiece held on the susceptor towards the opening of the baseplate. The control system is configured to space the susceptor from the baseplate by an unsealed gap during processing of a workpiece in the reaction chamber. Purge gases may flow through the gap into the reaction chamber. Methods of maintaining the gap during processing include calibrating the height of pads and capacitance measurements when the susceptor is spaced from the baseplate.

25 Claims, 6 Drawing Sheets

U.S. PATENT DOCUMENTS

| | | | |
|---|---|---|---|
| 6,048,154 A | 4/2000 | Wytman | |
| 6,106,634 A | 8/2000 | Ghanayem et al. | |
| 6,158,946 A | 12/2000 | Miyashita | |
| 6,224,312 B1 | 5/2001 | Sundar | |
| 6,224,679 B1 | 5/2001 | Sasaki et al. | |
| 6,286,230 B1 | 9/2001 | White et al. | |
| 6,312,525 B1 | 11/2001 | Bright et al. | |
| 6,409,837 B1 | 6/2002 | Hillman | |
| 6,488,778 B1 | 12/2002 | Ballantine et al. | |
| 6,536,136 B2 | 3/2003 | Saga | |
| 6,562,140 B1 | 5/2003 | Bondestam et al. | |
| 6,828,235 B2 | 12/2004 | Takano | |
| 6,875,280 B2 | 4/2005 | Ikeda et al. | |
| 6,899,507 B2 | 5/2005 | Yamagishi et al. | |
| 7,020,981 B2 * | 4/2006 | Shero et al. | 34/366 |
| 7,021,881 B2 | 4/2006 | Yamagishi et al. | |
| 7,022,613 B2 | 4/2006 | Pomarede et al. | |
| 7,276,123 B2 | 10/2007 | Shimizu et al. | |
| 2001/0000759 A1 | 5/2001 | Doley et al. | |
| 2002/0020344 A1 | 2/2002 | Takano | |
| 2003/0198741 A1 | 10/2003 | Uchida et al. | |
| 2003/0230322 A1 | 12/2003 | Hillman et al. | |
| 2004/0144311 A1 | 7/2004 | Chen et al. | |
| 2004/0144400 A1 | 7/2004 | Satoh et al. | |
| 2004/0166697 A1 | 8/2004 | Wang et al. | |
| 2004/0255985 A1 | 12/2004 | Xia et al. | |
| 2005/0022737 A1 | 2/2005 | Shimizu et al. | |
| 2005/0054196 A1 | 3/2005 | Wu et al. | |
| 2005/0268856 A1 | 12/2005 | Miller et al. | |
| 2006/0105548 A1 | 5/2006 | Kudo et al. | |
| 2006/0107970 A1 | 5/2006 | Verhaverbeke | |
| 2006/0130761 A1 | 6/2006 | Sakai | |
| 2007/0116873 A1 * | 5/2007 | Li et al. | 427/248.1 |
| 2010/0173432 A1 * | 7/2010 | White et al. | 438/17 |
| 2010/0202860 A1 * | 8/2010 | Reed et al. | 414/221 |

FOREIGN PATENT DOCUMENTS

| | | |
|---|---|---|
| JP | 1992-118925 | 4/1992 |
| JP | 05-275519 | 10/1993 |
| JP | 07-142391 | 6/1995 |
| JP | 1995-211761 | 8/1995 |
| JP | 07-273092 | 10/1995 |
| JP | 07-283147 | 10/1995 |
| JP | 1998-270527 | 10/1998 |
| JP | 1999-288992 | 10/1999 |
| JP | 11-330064 | 11/1999 |
| JP | 2003-059997 | 2/2003 |
| WO | WO 01/04935 | 1/2001 |

OTHER PUBLICATIONS

Japanese Office Action issued Mar. 25, 2009 in counterpart Japanese Patent Application No. 2004-508393.

* cited by examiner

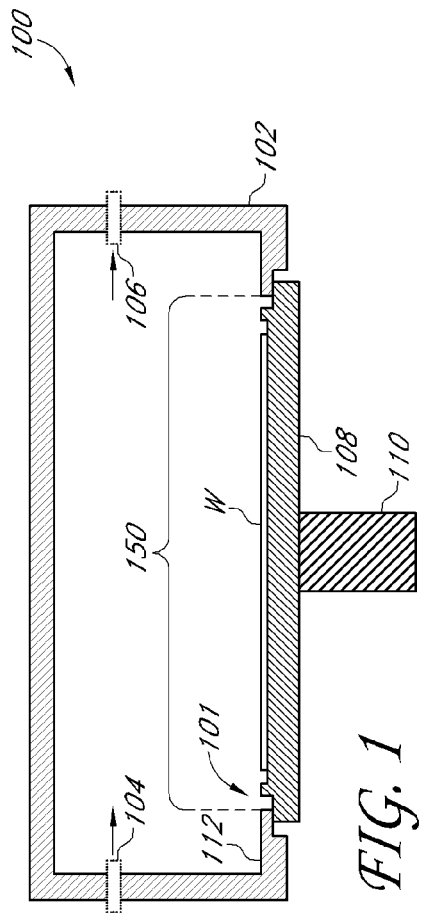
FIG. 1
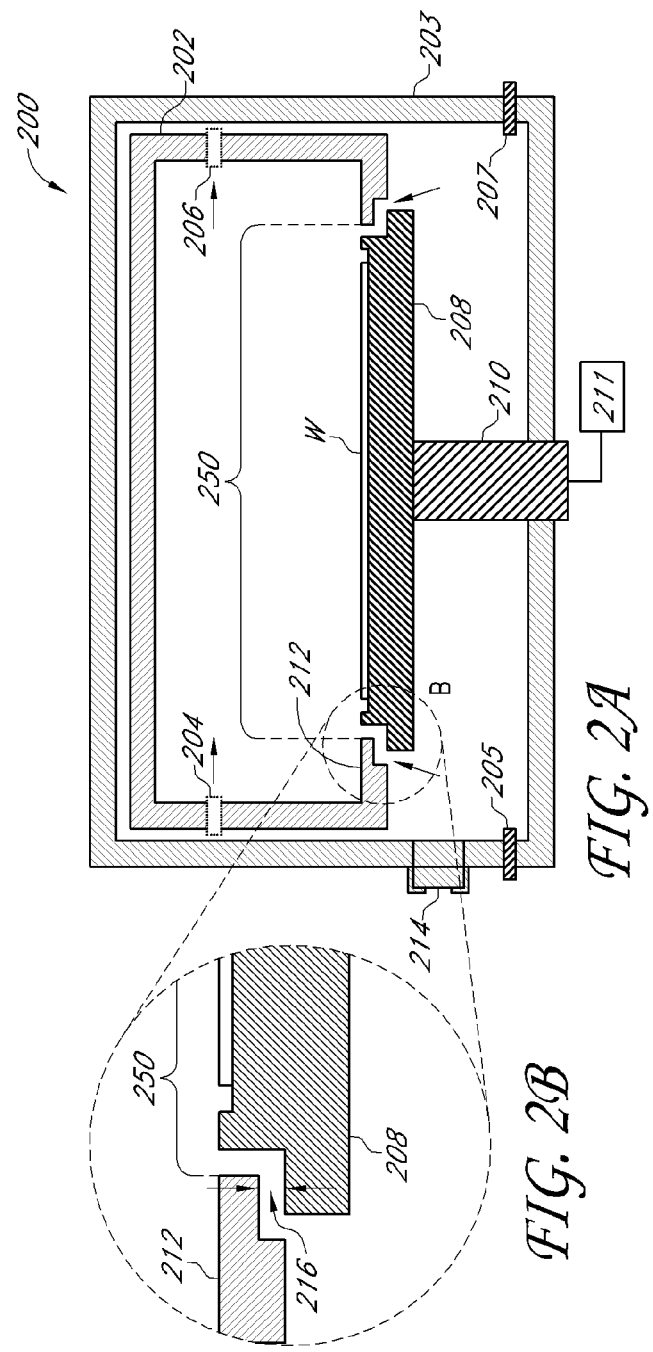
FIG. 2A
FIG. 2B

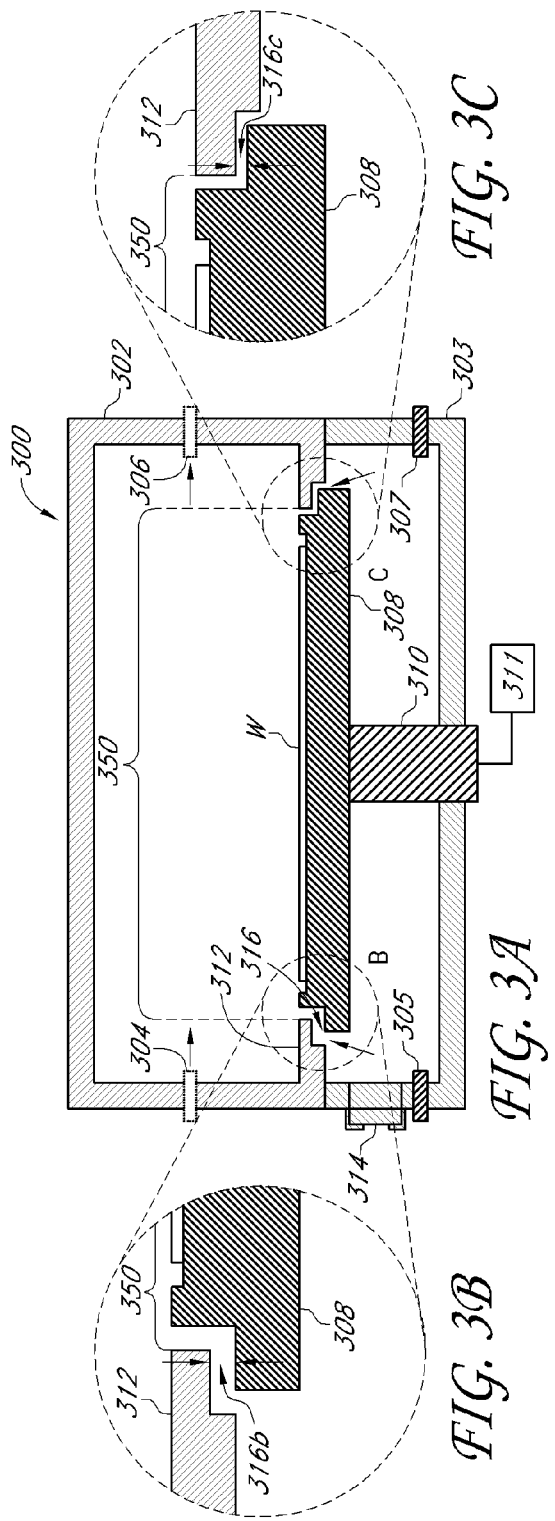
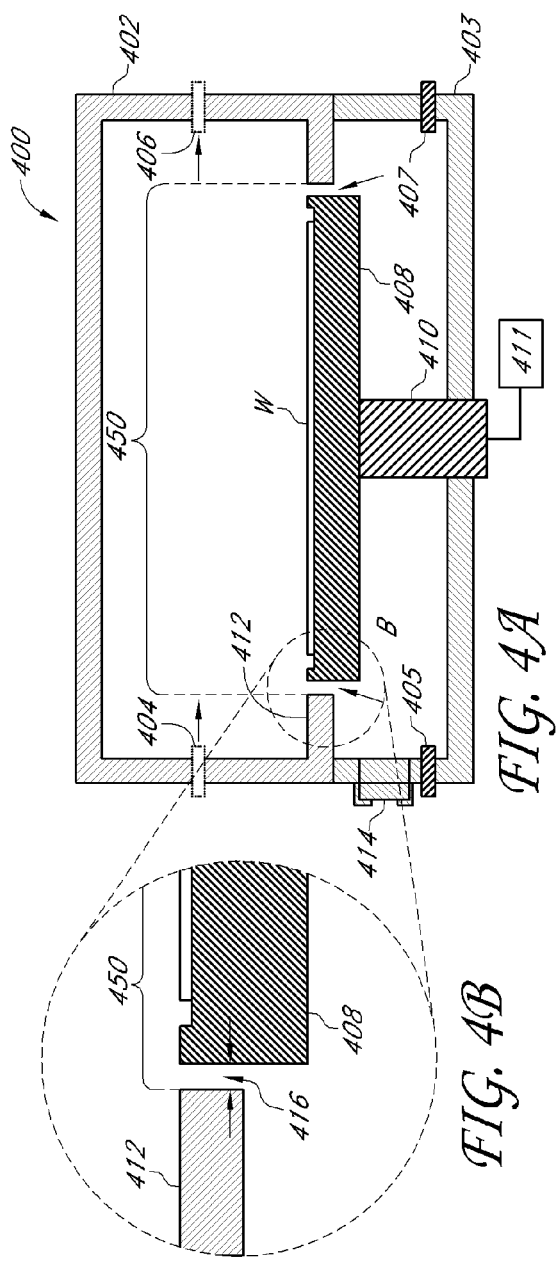

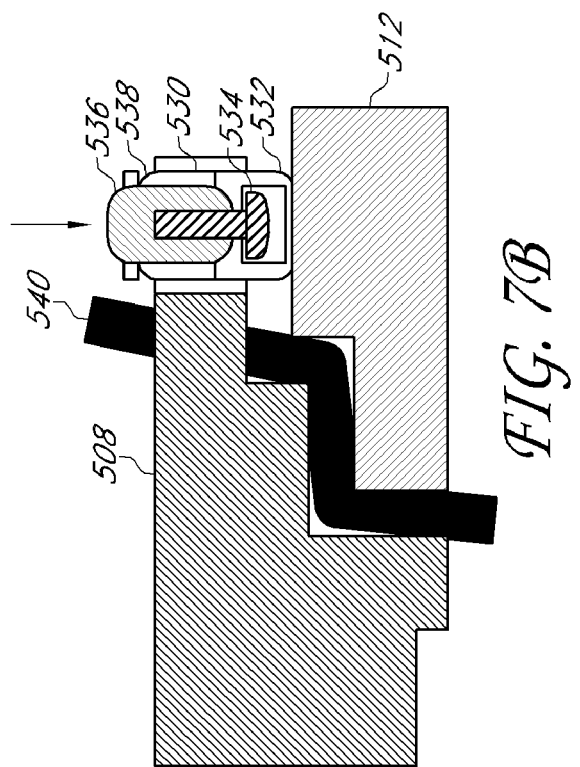
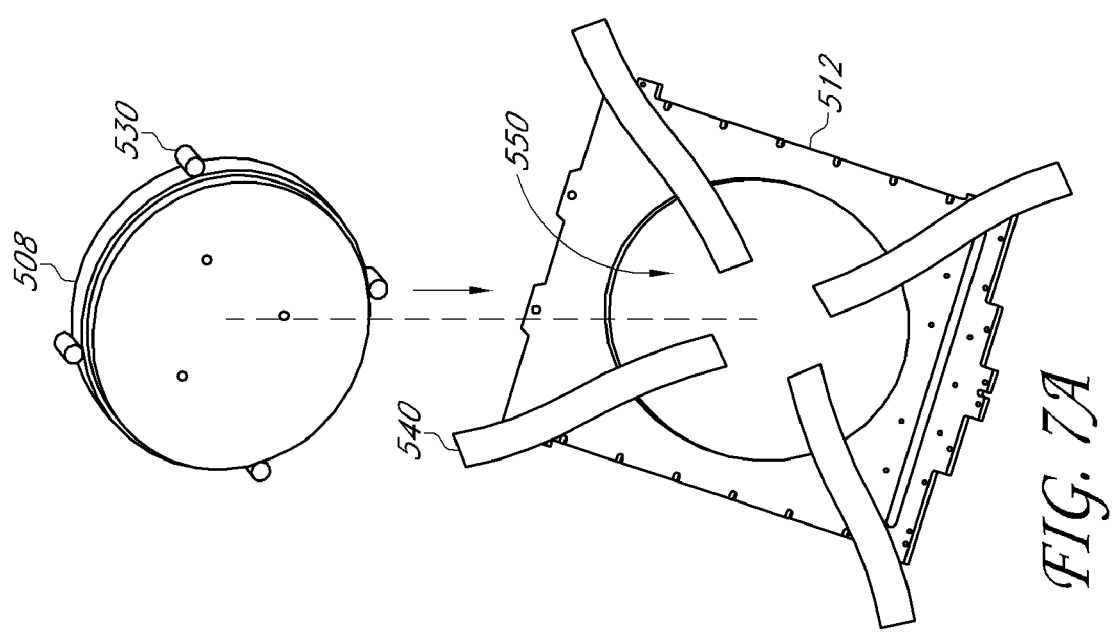

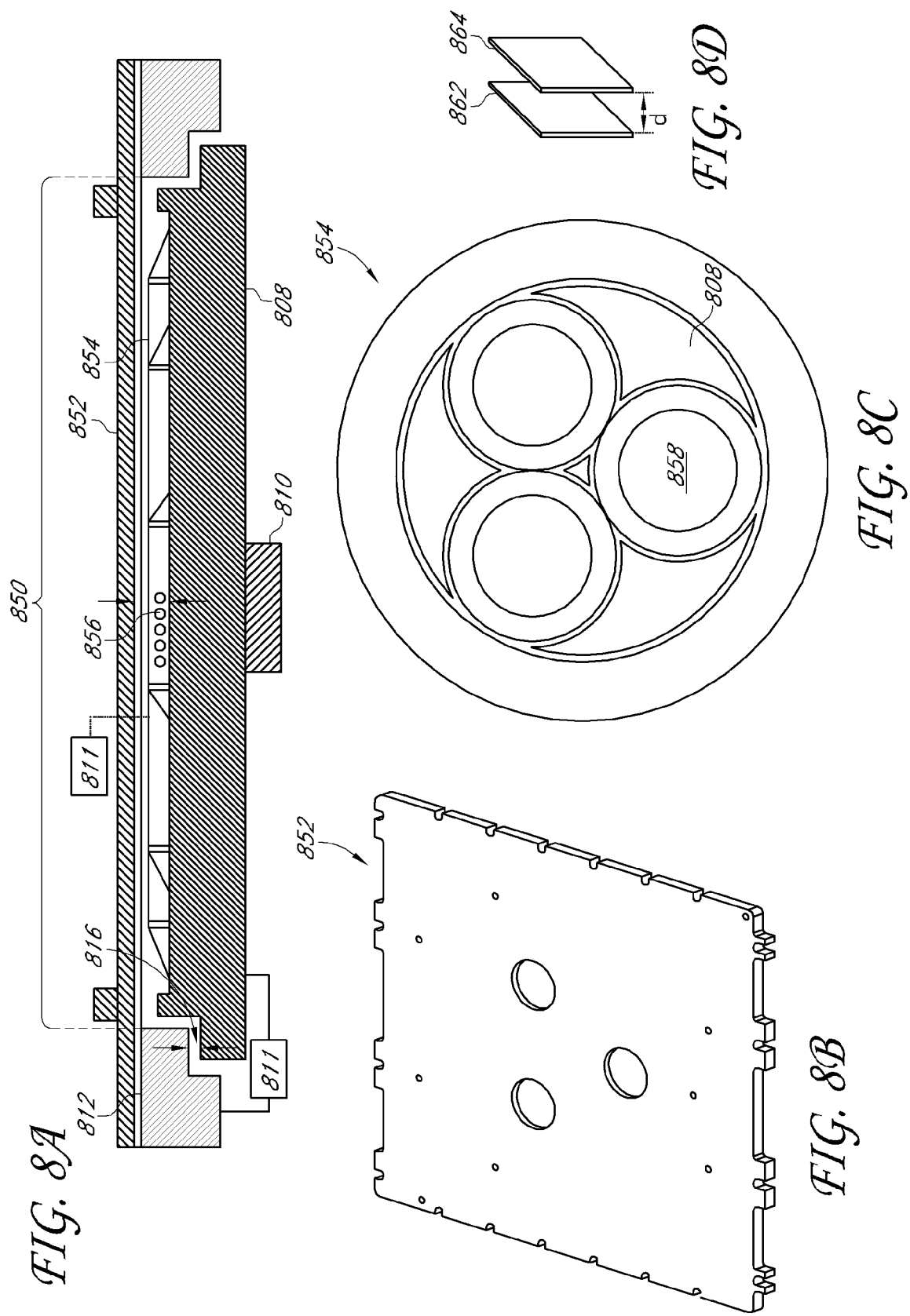

GAP MAINTENANCE FOR OPENING TO PROCESS CHAMBER

BACKGROUND

1. Field

The present invention relates to systems and methods for handling and processing semiconductor substrates and, in particular, to reactors used for the fabrication of thin films.

2. Description of the Related Art

In the processing of semiconductor devices, such as transistors, diodes, and integrated circuits, a plurality of such devices are typically fabricated simultaneously on a thin slice of semiconductor material, termed a substrate, wafer, or workpiece. When manufacturing such semiconductor devices, it is desirable that the workpiece does not become contaminated by particulates, which may lead to device failure. Accordingly, reactors in which workpieces are processed are typically sealed to prevent contamination from the exterior of the reaction space from entering the reaction space and to prevent reactants and reactant byproducts from escaping to the exterior of the reaction space.

SUMMARY

In certain embodiments, a semiconductor processing apparatus comprises a reaction chamber comprising a baseplate including an opening, a movable susceptor configured to hold a workpiece, a movement element configured to move a workpiece held on the susceptor towards the opening of the baseplate, and a control system configured to space the susceptor from the baseplate by an unsealed gap during processing of a workpiece in the reaction chamber.

In certain embodiments, a method of processing a semiconductor workpiece comprises loading a semiconductor workpiece onto a movable susceptor, moving the susceptor towards an opening in a baseplate of a reaction chamber, stopping movement of the susceptor when the susceptor is in a processing position, and processing the workpiece in the processing position while maintaining the gap. The susceptor is spaced from the baseplate by an unsealed gap in the processing position.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWINGS

These and other features, aspects, and advantages of the invention disclosed herein are described below with reference to the drawings of certain embodiments, which are intended to illustrate and not to limit the invention.

some embodiments, the susceptor 308 has previously been calibrated to stop in the processing position. For example, the susceptor 308 may comprise a plurality of adjustable pads 530 that have been calibrated, as described above with respect to FIGS. 7A and 7B. In certain such embodiments, stopping moving the susceptor 308 comprises contacting a plurality of Celazole®(PolyBenzImidazole) pads 520, 530 between the baseplate 312 and the susceptor 308. For another example, the movement element 311 may be calibrated based on a capacitance calibration workpiece, as described above with respect to FIGS. 8A-8D. In some embodiments, the susceptor 308 is spaced from the baseplate 312 using real time measurements as the susceptor is extended upwardly, for example including capacitance and/or distance traversed. The workpiece W is processed in the reaction chamber 302 while the gap 316 is maintained. In some embodiments, processing the workpiece W in the reaction chamber 302 comprises chemical vapor deposition. In some embodiments, processing the workpiece W in the reaction chamber 302 comprises atomic layer deposition. Process gases flow into the reaction chamber 302 through the inlet 304, interact with the workpiece W, and flow out of the reaction chamber 302 through the outlet 306. In some embodiments, gases such as nitrogen flow into the loading chamber 303 through the inlet 305, into the reaction chamber 302 through the gap 316, and out of the reaction chamber 302 through the outlet 306. In certain such embodiments, the outlet 307 is opened to adjust the flow of gases out of the loading chamber 303 into the reaction chamber 302.

FIG. 2A schematically illustrates a cross-section of another example of a semiconductor processing apparatus.

FIG. 2B is a blown up view of the region B in FIG. 2A.

FIG. 3A schematically illustrates a cross-section of yet another example of a semiconductor processing apparatus.

FIG. 3B is a blown up view of the region B in FIG. 3A.

FIG. 3C is a blown up view of the region C in FIG. 3A.

FIG. 4A schematically illustrates a cross-section of still another example of a semiconductor processing apparatus.

FIG. 4B is a blown up view of the region B in FIG. 4A.

FIGS. 7A and 7B illustrate an example method of calibrating adjustable pads.

FIGS. 8A-8D schematically illustrates an example calibration apparatus and method.

FIGS. 9A-9D illustrate an example method of processing a workpiece in the apparatus of FIG. 3A.

DETAILED DESCRIPTION

Figure 5B:
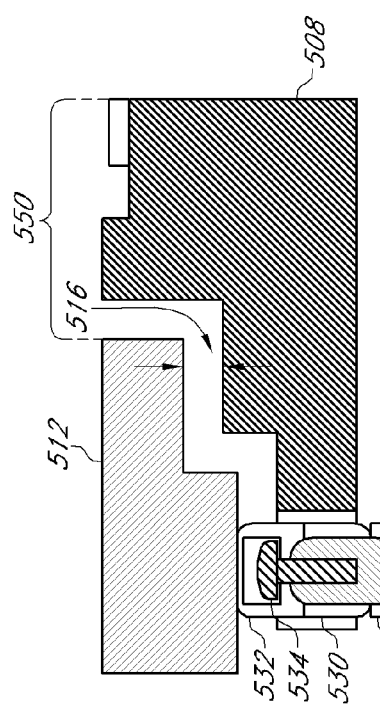
FIG. 5B schematically illustrates another example embodiment of a pad.

Although certain embodiments and examples are disclosed below, it will be understood by those in the art that the invention extends beyond the specifically disclosed embodiments and/or uses of the invention and obvious modifications and equivalents thereof Thus, it is intended that the scope of the invention herein disclosed should not be limited by the particular disclosed embodiments described below.

FIG. 1 schematically illustrates an example embodiment of a semiconductor processing apparatus 100 comprising a reaction chamber 102. The reaction chamber 102 comprises an inlet 104 and an outlet 106. Gases such as reactants and purge gases flow into the chamber 102 through the inlet 104, and gases such as excess reactants, reactant byproducts, and purge gases flow out of the chamber 102 through the outlet 106. The chamber 102 comprises a baseplate 112 including an opening 150. The apparatus 100 further comprises a susceptor 108 configured to be moved by operation of a movement element 110. The susceptor 108 is configured to hold a semiconductor workpiece W. The movement element 110 is configured to move the susceptor 108, and thus a workpiece W disposed on the susceptor 108, towards the opening 150 of the baseplate 112 to provide a seal between the interior of the chamber 102 and the exterior of the chamber 102, thereby creating a processing zone within the chamber 102.

In embodiments in which the susceptor 108 and the baseplate 112 comprise machined metal, the seal between the susceptor 108 and the baseplate 112 may not be perfect due to small, unintentional, gaps between the susceptor 108 and the baseplate 112 in areas where the surfaces are not perfectly planar and/or parallel. Force can be applied to the susceptor 108 and the baseplate 112 to attempt to reduce or eliminate these small gaps, for example using tensioned biasing elements. Such areas are typically small enough that processing is not adversely affected, and reduced pressure can be achieved within the chamber 102 relative to the exterior of the chamber 102. Each time a workpiece W is processed in the chamber 102, the susceptor 108 and the baseplate 112 make physical contact, which can contribute to metallic particle generation. Depending on the materials of the baseplate 112, the susceptor 108, and the processes performed in the reaction chamber 102, the particles may comprise, for example, Ti, $Al_2O_3$, and $HfO_2$. These metallic particles can be transported to the surface of the workpiece W, for example due to pressure differences between the reaction chamber 102 and the ambient environment.

In embodiments in which the reaction chamber 102 comprises an atomic layer deposition (ALD) reactor, the thickness of a workpiece W and/or the design of the susceptor 108 can create a dead-volume zone or a "dead zone" 101 upstream of the surface of the workpiece that can store a first precursor. The dead zone 101 may be an area of stagnation due to a lack of convective flow or a recirculation eddy caused by discontinuities in the surface of the reaction chamber 102 and/or susceptor 108. A dead zone 101 can be particularly disadvantageous when a second precursor is introduced to the reaction chamber 102, because cross-pulse chemical vapor deposition (CVD) can occur, in which the first and second precursors react to form contaminants on the reactor 102 or a processing workpiece W, and which can result in variations in the thickness of a layer deposited on the workpiece W. Long purges between pulses of precursors may be used to flush out the dead zone 101 and to avoid cross-pulse CVD. However, such an approach can disadvantageously result in reduced throughput. Additionally, complete flushing of the dead zone 101 is very difficult due to the finite thickness of the wafer.

FIG. 2A schematically illustrates an example embodiment of a semiconductor processing apparatus 200 comprising a reaction chamber 202 and a loading chamber 203. The loading chamber 203 substantially surrounds the reaction chamber 202. The reaction chamber 202 comprises an inlet 204 and an outlet 206. Gases such as reactants and purge gases flow into the chamber 202 through the inlet 204, and gases such as excess reactants, reactant byproducts, and purge gases flow out of the chamber 202 through the outlet 206. The depicted configuration, such as the positions, of the inlet 204 and the outlet 206 are merely schematic, and may be adjusted based on, for example, the process to be performed in the reaction chamber 202, the desired flow path of the gases, and the like. In some embodiments, the inlet 204 comprises a distribution system such as a showerhead. In certain embodiments, the reaction chamber 202 comprises a cross-flow atomic layer deposition chamber. The chamber 202 comprises a baseplate 212 including an opening 250. In some embodiments, an interior edge of the baseplate 212 defines the opening 250. In some embodiments, the baseplate 212 comprises titanium. Although the apparatus 200 is described herein with respect to CVD reactors, the apparatus 200 may also comprise other semiconductor processing tools, for example, but not limited to, dry etchers, ashers, rapid thermal annealers, etc.

The apparatus 200 further comprises a susceptor 208 configured to be moved by operation of a movement element 210. The susceptor 208 is configured to hold a semiconductor workpiece W. The susceptor 208 may comprise lift-pins and/or cutouts to aid in loading and unloading of the workpiece W. The susceptor 208 may comprise a vacuum system that holds the workpiece W in place after loading. The apparatus 200 comprises a port 214 for loading and unloading of workpieces W from the susceptor 208. Additional ports are also possible, for example one port for loading and one port for unloading. When the port 214 is closed, the loading chamber 203 may be sealed from the ambient environment to create a loading zone. In some embodiments, the movement element 210 comprises a pushrod or elevator that imparts vertical movement to the susceptor 208. In certain embodiments, the movement element 210 is configured to rotate a workpiece W disposed on the susceptor 208. The movement element 210 is configured to move the susceptor 208, and thus a workpiece W disposed on the susceptor 208, towards the opening 250 of the baseplate 212. The apparatus 200 further comprises a control system 211 configured to space the susceptor 208 from the baseplate 212 by an unsealed gap 216 during processing of a workpiece W in the reaction chamber 202. Although the control system 211 is illustrated as being in communication with the movement element 210, the control system 211 may be in communication with other portions of the apparatus 200, for example the susceptor or the baseplate as described below, and the like. In certain embodiments, the control system 211 is configured to stop the susceptor 208 from moving once the susceptor 208 is in a processing position in which the susceptor 208 is spaced from the baseplate 212 by the gap 216.

FIG. 2B illustrates a blown up view of the gap 216. In some embodiments, the gap 216 has a thickness of at least about 0.001 inches (approximately 25 µm) or at least about 0.005 inches (approximately 128 µm). In some embodiments, the gap 216 has a thickness between about 0.001 inches (approximately 25 µm) and about 0.05 inches (approximately (1275 µm). In the illustrated embodiment, there is no physical seal between the interior of the chamber 202 and the exterior of the chamber 202. In some embodiments, a processing zone is created within the chamber 202. In some embodiments, the loading chamber 203 is in fluid communication with the reaction chamber 202 during processing of a workpiece W in the reaction chamber 202. Each time a workpiece W is processed in the chamber 202, the susceptor 208 and the baseplate 212 do not make physical contact, which can advantageously reduce or eliminate the metallic particle generation mechanism described above. Accordingly, such particles cannot be transported to the surface of the workpiece W, thereby reducing defects in the devices created on the workpiece W.

An unsealed gap was previously thought to be unsuitable for certain reactors. For example, tight seals were the result of attempts to reduce or eliminate leakage of precursors out of the gap that might cause corrosion of the loading chamber 203, deposition and particle formation in the loading chamber 203, increased processing time due to reactant loss, and disturbance to laminar flow fields in the reaction chamber 202. However, at least one aspect of the present invention is the realization that these concerns may be reduced or eliminated by purging the vertical gap 216 with an inert gas. In certain embodiments, the loading chamber 203 comprises one or more inlets 205 defined between the susceptor 208 and the chamber 202. In certain such embodiments, the loading chamber 203 comprises one or more outlets 207 defined between the susceptor 208 and the chamber 202. Inert gases can flow from the inlet 205, through the loading chamber 203, and into the chamber 202 through the gap 216 to create a diffusion barrier. In certain embodiments, the inert gas comprises nitrogen at a flowrate of between about 0 sccm (standard cubic centimeters per minute) and about 200 sccm. Other inert gases, such as argon, are also possible. The flowrate may be increased or decreased depending on variables such as flowrate of gases through the reaction chamber 202, the dimensions of the susceptor 208 and/or the baseplate 212, the thickness and configuration of the gap 216, and the inert gas species. In certain embodiments, the flowrate of the inert gas is greater than about 200 sccm. In some embodiments, at least some of the inert gases flow out of the chamber 203 through the outlet 207. The depicted configuration, such as the positions, of the inlet 205 and the outlet 207 are merely schematic, and may be adjusted based on, for example, the process to be performed in the reaction chamber 202, the desired flow path of the gases, and the like.

In some embodiments, the pressure in the loading chamber 203 is higher than pressure in the reaction chamber 202, causing gases from the loading chamber 203 to flow into the processing chamber 202 through the gap 216 during processing of a workpiece W. In certain embodiments, the pressure is between about 0.1 Torr (approximately 13 Pa) and about 5 Torr (approximately 667 Pa) higher in the loading chamber 203 than in the processing chamber 202. In some embodiments, the inert gas curtain can reduce or prevent leakage of precursors and byproducts from the reaction chamber 202 into the surrounding environment or the loading chamber 203. Additionally, flushing the dead zone by flowing gases through the gap 216 can advantageously reduce cross-pulse CVD without protracted purge times. Reducing cross-pulse CVD can also reduce the build up of films in areas of purge gas flow. A barrier flow can also reduce ALD deposition in the area between the susceptor 208 and the baseplate 212. Thus, even if contact occurs between the susceptor 208 and the baseplate 212, such as during checking the reactor's rate of rise integrity, fewer particles are shed. Flushing a dead volume, which is almost impossible to completely eliminate due to finite thickness of workpiece W, can also reduce or eliminate a CVD source and film build up in the area where the inert gas flows from the loading chamber 203 to reaction chamber 202.

In certain alternative embodiments, the pressure in the reaction chamber 202 is higher than the pressure in the loading chamber 203, causing gases from the reaction chamber 202 to flow into the loading chamber 203 through the gap 216 during processing of a workpiece W. In certain embodiments, the pressure is between about 0.1 Torr (approximately 13 Pa) and about 5 Torr (approximately 667 Pa) higher in the processing chamber 202 than in the loading chamber 203. In some embodiments, the inert gas curtain can reduce or prevent contamination from flowing into the reaction chamber 202 from the loading chamber 203.

FIG. 3A schematically illustrates an example embodiment of a semiconductor processing apparatus 300 comprising a reaction chamber 302 and a loading chamber 303. The apparatus 300 is similar to the apparatus 200 described above, except the loading chamber 303 is disposed below the reaction chamber 302 rather than substantially surrounding the reaction chamber 302. When the movement element 310 moves the susceptor 308 towards the opening 350 of the baseplate 312, an unsealed gap 316 remains between the susceptor 308 and the baseplate 312. FIGS. 3B and 3C illustrate blown up views of the gap 316. A first portion 316b of the gap 316, illustrated in FIG. 3B, is larger than a second portion 316c of the gap 316, illustrated in FIG. 3C, such that the gap 316 is asymmetric. In some embodiments, the gap 316 is asymmetric due to manufacturing limitations. In some embodiments, the gap 316 is asymmetric by design. For example, more flushing may desirably occur upstream of the workpiece W by having a relatively large gap 316b, while less flushing may desirably occur downstream of the workpiece W by having a relatively small gap 316c.

The type of gap 216, 316 illustrated in FIGS. 2A-3C may be considered a vertical gap because at least a portion of the susceptor 208, 308 is vertically spaced from the baseplate 212, 312. The type of gap 216, 316 illustrated in FIGS. 2A-3C may be considered a labyrinth gap because the susceptor 208, 308 is vertically spaced from the baseplate 212, 312 at a first position and is horizontally spaced from the baseplate 212, 312 at a second position. A labyrinth gap can create a barrier to fluid flow, yet still prevent contact between the susceptor 208, 308 and the baseplate 212, 312. The susceptor 208, 308 and/or the baseplate 212, 312 may be differently shaped such that the gap 216, 316 is only vertical.

FIG. 4A schematically illustrates an embodiment of a semiconductor processing apparatus 400 that is similar to the apparatus 200 described above, except that the susceptor 408 and the baseplate 412 are shaped such that the gap 416 comprises an annular horizontal gap substantially surrounding the susceptor 408. In some embodiments, the susceptor 408 is dimensioned to pass through the opening 450 into the reaction chamber 402 without contacting the baseplate 412, thereby allowing adjustment of the position of the susceptor 408 and workpieces W held thereon within the reaction chamber 402. FIG. 4B illustrates a blown up view of the gap 416. A horizontal gap may reduce barriers to fluid flow due to the straight path created therethrough. Combinations of vertical, horizontal, and labyrinth gaps having the same or different dimensions may be advantageous for certain applications. For example, more flushing may desirably occur upstream of the workpiece W by having a relatively large horizontal gap 416, while less flushing may desirably occur downstream of the workpiece W by having a relatively small labyrinth gap 316c.

Figure 5A:
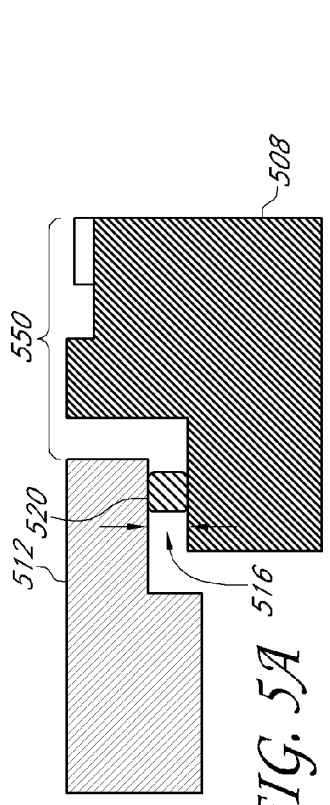
FIG. 5A schematically illustrates an example embodiment of a pad.

FIG. 5A schematically illustrates an embodiment in which one or more pads 520 are configured to space the susceptor 508 from the baseplate 512. The gap 516 comprises a vertical gap beneath the baseplate 512. In certain embodiments, the gap 516 is generally annular between the pads 520. In some embodiments, the pads 520 comprise Celazole® (PolyBenzImidazole) pads, although other materials are also possible. Celazole® (PolyBenzImidazole) has desirably properties under compression and can create a lubricious contact with titanium. In some embodiments, the pads 520 have a height between about 0.001 inches (approximately 25 μm) and about 0.05 inches (approximately 1275 μm). The pads 520 prevent the susceptor 508 from contacting the baseplate 512, thereby advantageously reducing or eliminating metallic particle generation that may be caused by physical contact between the susceptor 508 and the baseplate 512. In the embodiment illustrated in FIG. 5A, the pad 520 contacts the susceptor 508 and the baseplate 512. In some embodiments, the pads 520 are connected to a lower surface of the baseplate 512 and are configured to contact a peripheral edge of the susceptor 508 during processing of a workpiece W. In some alternative embodiments, the pads 520 are connected to a peripheral edge of the susceptor 508 and are configured to contact a lower surface of the baseplate 512 during processing of a workpiece W. However, embodiments are also possible where the pad 520 is spaced from the susceptor 508 or the baseplate 512 during processing of a workpiece W. In such embodiments, the height of the pad 520 is less than the vertical thickness of the gap 516 and may act as a preventative measure to avoid contact between the susceptor 508 and the baseplate 512.

FIG. 5B schematically illustrates an embodiment in which one or more adjustable pads 530 are configured to space the susceptor 508 from the baseplate 512. Each of the pads 530 has an adjustable height. The pad 530 comprises a landing pad 532, a pad mounting screw 534, an adjustment screw 536, and a jam nut 538, the interaction of which are described in more detail below. FIG. 5B also illustrates an embodiment in which the susceptor 508 and the baseplate 512 are shaped such that the gap 516 comprises a longer labyrinth. In some embodiments comprising pads 520, 530, the physical contact between a portion of the susceptor 508 and a portion of the baseplate 512 via the pads 520, 530 does not have to be proximate to the gap 516.

Figure 6B:
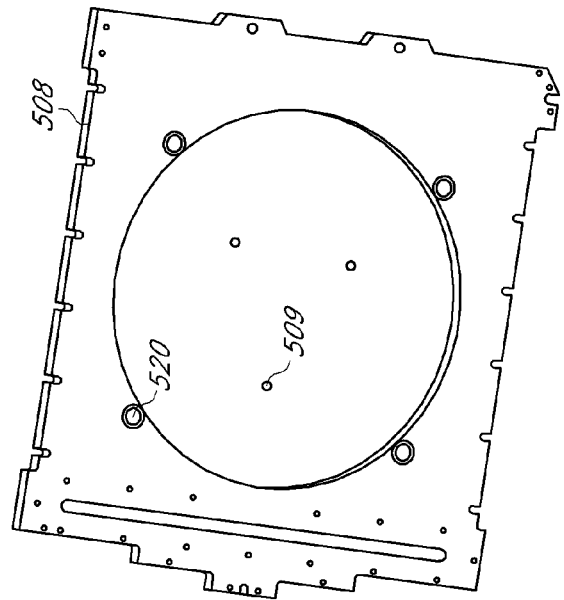
FIG. 6B is a top perspective view of another example embodiment of a susceptor.
Figure 6A:
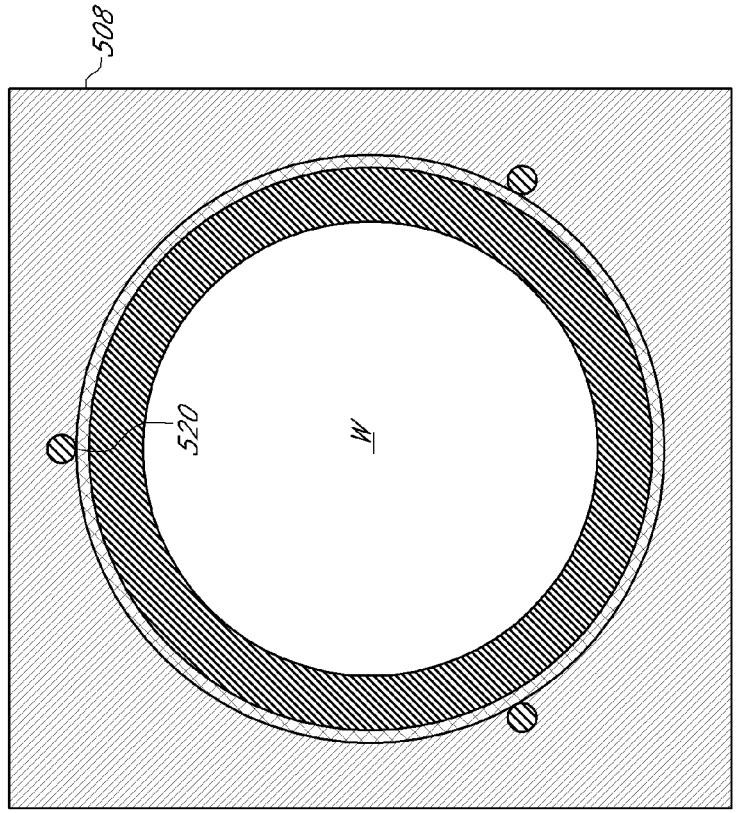
FIG. 6A is a top elevational view of an example embodiment of a susceptor.

FIG. 6A schematically illustrates a susceptor 508 comprising three pads 520. Alternatively, the susceptor 508 may comprise three pads 530, other types of pads, or combinations thereof. The susceptor 508 is illustrated holding a workpiece W to show that the pads 520 may be located away from the surface of the workpiece W. FIG. 6B illustrates a perspective view of a susceptor 508 comprising four pads 520. Alternatively, the susceptor 508 may comprise four pads 530, other types of pads, or combinations thereof. The susceptor 508 includes apertures 509 through which lift pins may aid in loading and unloading of a workpiece W. The susceptor 508 may comprise any number of pads, including zero. For example, the susceptor 508 may comprise at least one pad 520, 530, at least two pads 520, 530, at least three pads 520, 530, at least four pads 520, 530, etc. In some embodiments, pluralities of pads 520, 530 are disposed symmetrically around a periphery of the susceptor 508.

FIGS. 7A and 7B illustrate an example method of calibrating the adjustable pads 530 to maintain a gap 516 during processing of a workpiece W. As depicted in FIG. 7A, the baseplate 512 rests face down, preferably on a soft and/or flat surface. The material of the shims 540 may be selected to reduce contamination of the baseplate 512 and/or the susceptor 508. A plurality of shims 540 are then draped across the opening 550. A first portion of the shims 540 rests on the baseplate 512 while a second portion of the shims 540 falls into the opening 550 of the baseplate 512. The susceptor 508 is placed face down into the opening 550 of the baseplate 512. In embodiments in which gap uniformity is desired, the susceptor 508 is centered with substantially equal spacing between the susceptor 508 and the opening 550 of the baseplate 512. The weight of the susceptor 508 pushes the shims 540 into the clearance between the susceptor 508 and the baseplate 512. Referring now to FIG. 7B, the pad 530 comprises a landing pad 532, a pad mounting screw 534, an adjustment screw 536, and a jam nut 538. The pad mount screw 534 is mechanically coupled to the adjustment screw 536. As the adjustment screw 536 is rotated, the landing pad 532 moves laterally, as indicated by the arrow. With the shims 540 in place, the adjustment screw 536 is rotated until the landing pad 532 of the pad 530 contacts the baseplate 512. While holding the adjustment screw 536 in place, the jam nut 538 is tightened, thereby locking the adjustment screw 536 and the landing pad 532 in a secured position such that the thickness of the pad 530 is calibrated based on the thickness of the shims 540. If the susceptor 508 is lifted, the shims 540 are extracted, and the susceptor 508 is again placed face down on the baseplate 512, the calibrated pads 530 will space the susceptor 508 from the baseplate 512 by the gap 516, as illustrated in FIG. 5B. This calibration method can be fast and effective, and can reduce or eliminate bulky and/or costly fixtures and gauges. This calibration method can also compensate for part tolerance variations.

FIG. 8A schematically illustrates another example calibration apparatus and method. A top plate 852 is placed over the baseplate 812. The top plate 852 provides a conductive surface in the opening 850 of the baseplate 812 to provide a closer conductive surface with which to measure capacitance with a calibration workpiece 854, thereby increasing the accuracy of the calibration. FIG. 8B is a top perspective view of an example embodiment of a top plate 852. Referring again to FIG. 8A, the calibration workpiece 854 is disposed on the susceptor 808 instead of a workpiece W. FIG. 8C is a top elevational view of an example embodiment of a calibration workpiece 854. The calibration workpiece 854 comprises a plurality of distance sensors 858. The calibration workpiece 854 may also comprise status lights 856 and a battery. In some embodiments, the calibration workpiece 854 is configured to communicate with a control system 811, either via a connector or wirelessly, as illustrated by the dotted lines in FIG. 8A. In some embodiments, the calibration workpiece 854 comprises a WaferSense™ Auto Gapping System, available from CyberOptics® Semiconductor, Inc. of Beaverton, Oreg.

The movement element 810 is configured to stop moving the susceptor 808 when the capacitance measured by the control system 811 indicates that the susceptor 808 is spaced from the baseplate 812 by an unsealed gap 816 having desired dimensions. The top plate 852 and the calibration workpiece 854 are then removed, but the movement element 810 has been programmed to stop moving the susceptor 808 such that the unsealed gap 816 is maintained upon subsequent movements of the susceptor 808 towards the baseplate 812. Other portions of the reaction chamber, for example an inlet showerhead, may also comprise the second conductive surface. This calibration method may be particularly advantageous for embodiments in which the gap 816 is only horizontal. This calibration method can also eliminate hard-stop contact surfaces such as the pads 520, 530.

FIG. 8D is a schematic view of capacitance between two conductive surfaces 862, 864. Capacitance is an electrical property of two conductive surfaces separated by an insulator. The capacitance between a first conductive surface 862 and a second conductive surface 864 separated by a distance d is therefore proportional to a product of the area between the surfaces 862, 864 and the dielectric constant of the material therebetween, and is inversely proportional to the distance d. As the surfaces 862, 864 move closer together, the capacitance increases, and as the surfaces 862, 864 move farther apart, the capacitance decreases. Thus, the capacitance of the insulator between the top plate 852 and the calibration workpiece 854 can be accurately correlated to the distance between the top plate 852 and the calibration workpiece 854.

In alternative embodiments, the baseplate 812 may comprise the first conductive surface and the susceptor 808 may comprise the second conductive surface. As the susceptor 808 moves relative to the baseplate 812, the capacitance between the first conductive surface and the second conductive surface changes. A control system 811 in communication with the susceptor 808 and/or the baseplate 812 comprises a capacitance measuring device and is configured to measure the capacitance between the first conductive surface of the baseplate 812 and the second conductive surface of the susceptor 808. In some embodiments, stopping moving the susceptor 808 comprises indicating that the measured capacitance is proximate to a predetermined value. In some embodiments, stopping moving the susceptor 808 comprises indicating that a distance or other value determined from the measured capacitance is proximate to a predetermined value. The susceptor 808 is stopped when the measured capacitance or a calculation based thereon indicates that the susceptor 808 is spaced from the baseplate 812 by an unsealed gap 816 having desired dimensions. In some embodiments, combinations of calibration methods may be used. For example, a calibration workpiece 854 may be used to provide the gap 816, and the capacitance between surfaces of the baseplate 812 and the susceptor 808 may be measured to avoid contact between the baseplate 812 and the susceptor 808.

Figure 9A:
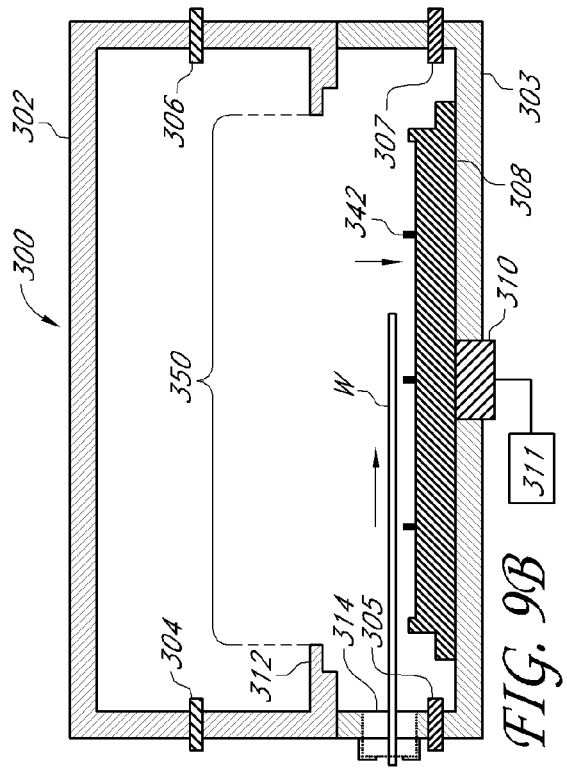
Figure 9B:
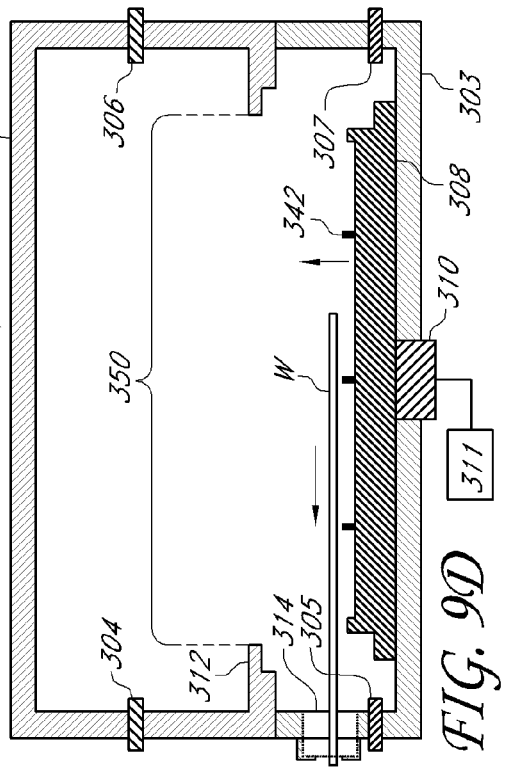

FIGS. 9A-9D illustrate an example method of processing a workpiece W in the apparatus 300 of FIG. 3. However, the method can be applied to the apparatuses described herein, as well as to other suitable semiconductor workpiece processing apparatuses. In FIG. 9A, the susceptor 308 is in a retracted position and the process chamber 302 and the loading chamber 303 is sealed because the port 314 is closed. In the illustrated embodiment, a plurality of lift pins 342 are extended above the portion of the susceptor 308 that holds the workpiece W, for example through the apertures 509 illustrated in FIG. 6B. In FIG. 9B, the port 314 is opened to allow a workpiece W to be loaded onto the susceptor. In some embodiments, the workpiece W is a semiconductor workpiece. The workpiece W is placed onto the lift pins 342, which are then lowered such that the workpiece W rests on the susceptor 308. In some embodiments, a vacuum is applied to keep the workpiece W fastened to the susceptor 308. In some embodiments, the inlet 305 and/or the outlet 307 are opened to allow gases to flow through the loading chamber 303 during loading.

Figure 9C:
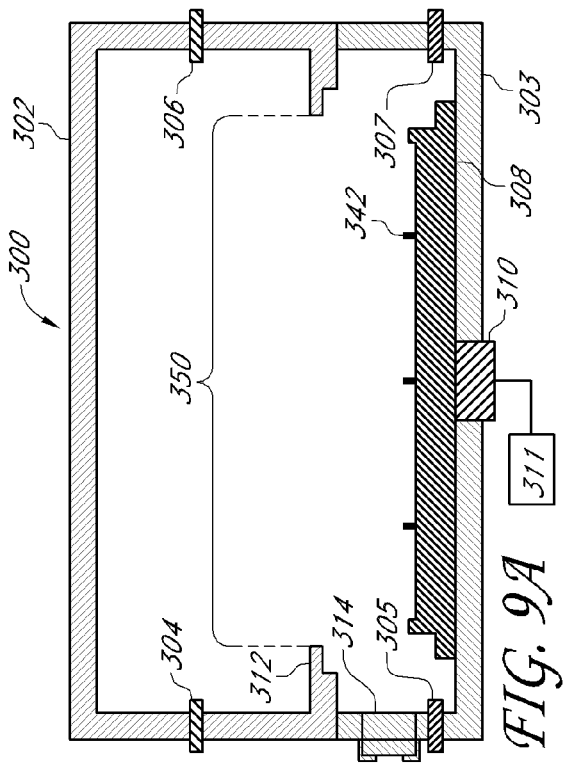
Figure 9D:
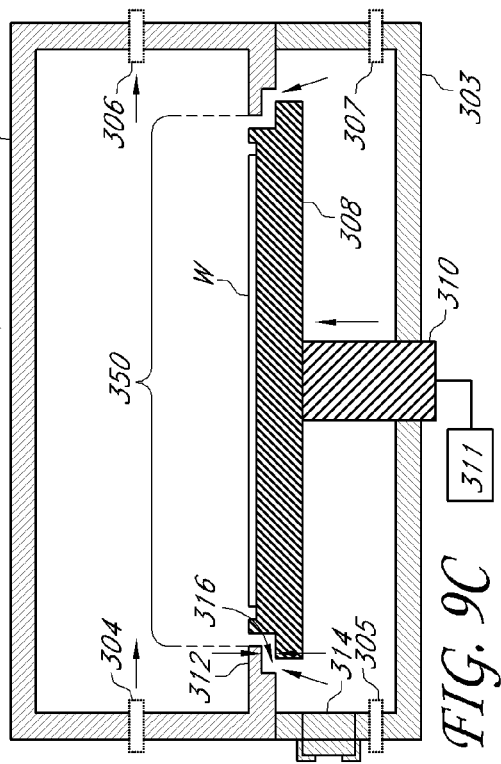
As illustrated in FIG. 9D, after processing, the susceptor 308 is retracted and the workpiece W is unloaded through the port 314. In some embodiments, a vacuum is released such that the workpiece W is no longer fastened to the susceptor 308. The lift pins 342 are raised to raise the workpiece W from the susceptor 308, where it can be accessed by a robot or other removal device. In some embodiments, the inlet 305 and/or the outlet 307 are opened to allow gases to flow through the loading chamber 303 during unloading. 1 schematically illustrates a cross-section of an example of a semiconductor processing apparatus.

FIG. 9C illustrates that after the workpiece W is loaded onto the susceptor 308, the susceptor 308 is moved towards the opening 350 in the baseplate 312 of the reaction chamber 302. The movement of the susceptor 308 is stopped when the susceptor 308 is in a processing position in which the susceptor 308 is spaced from the baseplate 312 by an unsealed gap 316. In some embodiments, the susceptor 308 has previously been calibrated to stop in the processing position. For example, the susceptor 308 may comprise a plurality of adjustable pads 530 that have been calibrated, as described above with respect to FIGS. 7A and 7B. In certain such embodiments, stopping moving the susceptor 308 comprises contacting a plurality of Celazole® (PolyBenzImidazole) pads 520, 530 between the baseplate 312 and the susceptor 308. For another example, the movement element 311 may be calibrated based on a capacitance calibration workpiece, as described above with respect to FIGS. 8A-8D. In some embodiments, the susceptor 308 is spaced from the baseplate 312 using real time measurements as the susceptor is extended upwardly, for example including capacitance and/or distance traversed. The workpiece W is processed in the reaction chamber 302 while the gap 316 is maintained. In some embodiments, processing the workpiece W in the reaction chamber 302 comprises chemical vapor deposition. In some embodiments, processing the workpiece W in the reaction chamber 302 comprises atomic layer deposition. Process gases flow into the reaction chamber 302 through the inlet 304, interact with the workpiece W, and flow out of the reaction chamber 302 through the outlet 306. In some embodiments, gases such as nitrogen flow into the loading chamber 303 through the inlet 305, into the reaction chamber 302 through the gap 316, and out of the reaction chamber 302 through the outlet 306. In certain such embodiments, the outlet 307 is opened to adjust the flow of gases out of the loading chamber 303 into the reaction chamber 302. As illustrated in FIG. 9D, after processing, the susceptor 308 is retracted and the workpiece W is unloaded through the port 314. In some embodiments, a vacuum is released such that the workpiece W is no longer fastened to the susceptor 308. The lift pins 342 are raised to raise the workpiece W from the susceptor 308, where it can be accessed by a robot or other removal device. In some embodiments, the inlet 305 and/or the outlet 307 are opened to allow gases to flow through the loading chamber 303 during unloading.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof For example, the dead zone 101 of FIG. 1 may be reduced or eliminated by methods other than flowing gases from a loading chamber, such as a dedicated purge supply gas to force particles away from the reaction chamber 100. In addition, while several variations of the invention have been shown and described in detail, other modifications, which are within the scope of this invention, will be readily apparent to those of skill in the art based upon this disclosure. For example, the invention is not limited to the methods of maintaining a gap between a susceptor and a baseplate described herein. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. For example, the gap may be non-uniform in the apparatuses 200, 400 of FIGS. 2 and 4, respectively. For another example, the loading chamber 303, 403 may substantially surround the reaction chamber 302, 402 in the apparatuses 300, 400 of FIGS. 3 and 4, respectively. Thus, it is intended that the scope of the present invention herein disclosed should not be limited by the particular disclosed embodiments described above, but should be determined only by a fair reading of the claims that follow.

What is claimed is:
1. A semiconductor processing apparatus comprising:
a reaction chamber comprising a baseplate including an opening;
a movable susceptor configured to hold a workpiece;
a movement element configured to move a workpiece held on the susceptor towards the opening of the baseplate; and
a control system configured to space the susceptor from the baseplate by an unsealed gap during processing of a workpiece in the reaction chamber.

2. The apparatus of claim 1, wherein gap has a thickness of at least about 0.001 inches (approximately 25 µm).

3. The apparatus of claim 1, further comprising a plurality of PolyBenzlmidazole pads configured to space the susceptor from the baseplate, the gap comprising a vertical gap beneath the baseplate.

4. The apparatus of claim 3, wherein the gap is generally annular between the pads.

5. The apparatus of claim 3, wherein the pads are connected to a lower surface of the baseplate and are configured to contact a peripheral edge of the susceptor during processing of a workpiece.

6. The apparatus of claim 3, wherein the pads are connected to a peripheral edge of the susceptor and are configured to contact a lower surface of the baseplate during processing of a workpiece.

7. The apparatus of claim 3, wherein each of the plurality of pads has an adjustable height.

8. The apparatus of claim 3, wherein the plurality of pads comprises at least three pads.

9. The apparatus of claim 3, wherein the baseplate comprises titanium.

10. The apparatus of claim 1, wherein the baseplate comprises a first conductive surface, wherein the susceptor comprises a second conductive surface, the apparatus further comprising a capacitance measurement device configured to measure capacitance between the first conductive surface and the second conductive surface.

11. The apparatus of claim 1, further comprising a loading chamber below the reaction chamber, the loading chamber in fluid communication with the reaction chamber through the gap during processing of a workpiece in the reaction chamber.

12. The apparatus of claim 1, wherein the susceptor is dimensioned to pass through the opening and wherein the gap comprises an annular horizontal gap substantially surrounding the susceptor.

13. The apparatus of claim 1, wherein the reaction chamber comprises a cross-flow atomic layer deposition reactor.

14. A method of processing a semiconductor workpiece, the method comprising:
   loading a semiconductor workpiece onto a movable susceptor;
   moving the susceptor towards an opening in a baseplate of a reaction chamber;
   stopping movement of the susceptor when the susceptor is in a processing position, the susceptor spaced from the baseplate by an unsealed gap in the processing position; and
   processing the workpiece in the processing position while maintaining the gap.

15. The method of claim 14, wherein loading the workpiece is performed in a loading chamber and wherein processing the workpiece comprises maintaining a higher pressure in the loading chamber than in the processing chamber.

16. The method of claim 15, wherein the pressure is between about 0.1 Torr (approximately 13 Pa) and about 5 Torr (approximately 667 Pa) higher in the loading chamber than in the reaction chamber.

17. The method of claim 15, wherein maintaining the higher pressure comprising flowing nitrogen into the loading chamber during processing.

18. The method of claim 17, wherein flowing the nitrogen is at between about 0 sccm and about 200 sccm.

19. The method of claim 14, wherein stopping moving comprises contacting a plurality of PolyBenzlmidazole pads between the baseplate and the susceptor.

20. The method of claim 14, wherein the baseplate comprises a first conductive surface and the susceptor comprises a second conductive surface, wherein moving the susceptor comprises measuring a capacitance between the first conductive surface and the second conductive surface, and wherein stopping moving comprises indicating that the measured capacitance is proximate to a predetermined value.

21. The method of claim 14, wherein processing the workpiece comprises atomic layer deposition.

22. The method of claim 14, further comprising calibrating the movement element to stop when the susceptor is in the processing position.

23. The method of claim 22, wherein calibrating the movement element comprises:
   resting the baseplate face down;
   draping a plurality of shims across the opening of the baseplate;
   centering the susceptor with the opening of the baseplate;
   placing the susceptor face down into the opening of the baseplate;
   turning an adjusting screw until a pad of the susceptor contacts the baseplate; and
   holding the adjusting screw in place while tightening a jam nut.

24. The method of claim 22, wherein calibrating the movement element comprises:
   moving the susceptor towards the opening, the susceptor including a first conductive surface and the baseplate including a second conductive surface;
   measuring a capacitance between the first conductive surface and the second conductive surface; and
   configuring the movement element to stop moving the susceptor when the measured capacitance indicates that the susceptor is spaced from the baseplate by an unsealed gap having desired dimensions.

25. The method of claim 22, wherein calibrating the movement element comprises:
   loading a calibration workpiece onto the movable susceptor;
   moving the susceptor towards the opening, the calibration workpiece including a first conductive surface and the baseplate including a second conductive surface;
   measuring a capacitance between the first conductive surface and the second conductive surface;
   configuring the movement element to stop moving the susceptor when the measured capacitance indicates that the susceptor is spaced from the baseplate by an unsealed gap having desired dimensions; and
   unloading the calibration workpiece.

* * * * *

UNITED STATES PATENT AND TRADEMARK OFFICE
CERTIFICATE OF CORRECTION

PATENT NO. : 8,216,380 B2
APPLICATION NO. : 12/350793
DATED : July 10, 2012
INVENTOR(S) : White et al.

Page 1 of 2

It is certified that error appears in the above-identified patent and that said Letters Patent is hereby corrected as shown below:

In column 2, lines 1-36, replace:
"some embodiments, the susceptor 308 has previously been calibrated to stop in the processing position. For example, the susceptor 308 may comprise a plurality of adjustable pads 530 that have been calibrated, as described above with respect to FIGS. 7A and 7B. In certain such embodiments, stopping moving the susceptor 308 comprises contacting a plurality of Celazole® (PolyBenzImidazole) pads 520, 530 between the baseplate 312 and the susceptor 308. For another example, the movement element 311 may be calibrated based on a capacitance calibration workpiece, as described above with respect to FIGS. 8A-8D. In some embodiments, the susceptor 308 is spaced from the baseplate 312 using real time measurements as the susceptor is extended upwardly, for example including capacitance and/or distance traversed. The workpiece W is processed in the reaction chamber 302 while the gap 316 is maintained. In some embodiments, processing the workpiece W in the reaction chamber 302 comprises chemical vapor deposition. In some embodiments, processing the workpiece W in the reaction chamber 302 comprises atomic layer deposition. Process gases flow into the reaction chamber 302 through the inlet 304, interact with the workpiece W, and flow out of the reaction chamber 302 through the outlet 306. In some embodiments, gases such as nitrogen flow into the loading chamber 303 through the inlet 305, into the reaction chamber 302 through the gap 316, and out of the reaction chamber 302 through the outlet 306. In certain such embodiments, the outlet 307 is opened to adjust the flow of gases out of the loading chamber 303 into the reaction chamber 302. As illustrated in FIG. 9D, after processing, the susceptor 308 is retracted and the workpiece W is unloaded through the port 314. In some embodiments, a vacuum is released such that the workpiece W is no longer fastened to the susceptor 308. The lift pins 342 are raised to raise the workpiece W from the susceptor 308, where it can be accessed by a robot or other removal device. In some embodiments, the inlet 305 and/or the outlet 307 are opened to allow gases to flow through the loading chamber 303 during unloading. 1"
    with -- FIG. 1 --
In column 3, line 3, change "thereof" with -- thereof. --
In column 6, line 64-65, change "(PolyBenzlmidazole)" with -- (PolyBenzImidazole) --
In column 7, line 38, change "thereof" with -- thereof. --

Signed and Sealed this
Sixth Day of November, 2012

David J. Kappos
*Director of the United States Patent and Trademark Office*

CERTIFICATE OF CORRECTION (continued)
U.S. Pat. No. 8,216,380 B2

In column 7, line 43, change "thereof" with -- thereof. --
In column 10, line 30, change "thereof" with -- thereof. --
In Claim 3, column 11, line 4, change "PolyBenzlmidazole" with -- PolyBenzImidazole --
In Claim 19, column 12, line 7, change "PolyBenzlmidazole" with -- PolyBenzImidazole --